US009880210B2

United States Patent
Patton et al.

(10) Patent No.: US 9,880,210 B2
(45) Date of Patent: Jan. 30, 2018

(54) SCANNER SYSTEM AND METHOD FOR HIGH-RESOLUTION SPATIAL SCANNING OF AN ELECTROMAGNETIC FIELD RADIATED BY AN ELECTRONIC DEVICE UNDER TEST

(71) Applicant: EMSCAN CORPORATION, Calgary (CA)

(72) Inventors: Ruska Patton, Calgary (CA); Yiping Zhou, Calgary (CA); Gil Montag, Calgary (CA); Robert Xue, Calgary (CA)

(73) Assignee: EMSCAN CORPORATION, Calgary (CA)

( * ) Notice: Subject to any disclaimer, the term of this patent is extended or adjusted under 35 U.S.C. 154(b) by 0 days.

(21) Appl. No.: 15/111,229

(22) PCT Filed: Jan. 29, 2015

(86) PCT No.: PCT/CA2015/050060
§ 371 (c)(1),
(2) Date: Jul. 13, 2016

(87) PCT Pub. No.: WO2015/113153
PCT Pub. Date: Aug. 6, 2015

(65) Prior Publication Data
US 2016/0334450 A1 Nov. 17, 2016

Related U.S. Application Data

(60) Provisional application No. 61/933,423, filed on Jan. 30, 2014.

(51) Int. Cl.
*G01R 1/073* (2006.01)
*G01R 29/08* (2006.01)
(Continued)

(52) U.S. Cl.
CPC ......... *G01R 29/0814* (2013.01); *G01R 1/073* (2013.01); *G01R 23/16* (2013.01);
(Continued)

(58) Field of Classification Search
CPC .. G01R 29/08; G01R 29/0814; G01R 31/001; G01R 33/286; G01R 33/288; G01R 1/07
(Continued)

(56) References Cited

U.S. PATENT DOCUMENTS

| 5,300,879 A | 4/1994 | Masuda et al. |
| 6,268,738 B1 | 7/2001 | Gunthorpe et al. |

(Continued)

FOREIGN PATENT DOCUMENTS

| CN | 102162828 | 8/2011 |
| CN | 202013428 | 10/2011 |

(Continued)

OTHER PUBLICATIONS http://www.detectus.se/rse-series.html; RSE Series—EMC scanners for near field measurements.
(Continued)

*Primary Examiner* — Melissa Koval
*Assistant Examiner* — Trung Nguyen
(74) *Attorney, Agent, or Firm* — Bennett Jones LLP (57) ABSTRACT

A scanner system and method operable for high-resolution spatial scanning of an electromagnetic field radiated by an electronic device under test (DUT) are provided. The electromagnetic field level radiated by the DUT is measured with a probe array comprising a plurality of spatially separated switched probes, an analyzer, and a computer. An actuator changes the relative position of the probe array to the DUT by a distance less than or equal to the separation
(Continued)

distance between the probes, and the electromagnetic field level is measured and stored again.

20 Claims, 9 Drawing Sheets (51) Int. Cl.
G01R 23/16 (2006.01)
G01R 31/00 (2006.01)
G01R 1/07 (2006.01)

(52) U.S. Cl.
CPC ......... G01R 29/0878 (2013.01); G01R 31/00 (2013.01); G01R 31/001 (2013.01); G01R 1/07 (2013.01); G01R 29/08 (2013.01)

(58) Field of Classification Search
USPC .......... 324/300, 310, 500, 559, 76.11, 76.26, 324/77.11, 600, 612, 750.12, 144; 342/22, 78, 96, 158, 185, 371, 375
See application file for complete search history.

(56) References Cited

U.S. PATENT DOCUMENTS

| 7,672,640 | B2 | 3/2010 | Nyshadham et al. |
| 8,472,881 | B2 | 6/2013 | Scheucher |
| 8,502,546 | B2 | 8/2013 | Nyshadham et al. |
| 9,316,714 | B2 | 4/2016 | Rada et al. |
| 9,417,356 | B2* | 8/2016 | Chen .................. G01V 8/20 |
| 2004/0183529 | A1 | 9/2004 | Kajiwara et al. |
| 2007/0023656 | A1* | 2/2007 | Tomita .............. G01R 31/305 250/310 |
| 2009/0110041 | A1 | 4/2009 | Mellein |
| 2009/0237092 | A1 | 9/2009 | Zoughi et al. |
| 2011/0101961 | A1 | 5/2011 | Gao et al. |

FOREIGN PATENT DOCUMENTS

| CN | 102565546 | 7/2012 |
| CN | 101750546 | 10/2012 |
| JP | 3163016 | 5/2001 |
| WO | 2007112546 | 10/2007 |

OTHER PUBLICATIONS http://www.noiseken.com/modules/products/index.php?content_id=242; Emission Measurement Systems for PCB Product Overview.
Payandehjoo K et al.; De-Embeding the Effect of a Printed Array of Probes on Planar Very-Near-Field Measurements; Antenna Measurements & Applications (CAMA), Nov. 16-19, 2014 IEEE Conference.
Mook G et al., "Electromagnetic Imaging Using Probate Arrays", Conference Proceedings, The 10th International Conference of the Slovenian Society for Non-Destructive Testing Titled "Application of Contemporary Non-Destructive Testing in Enginnering": Ljubljana, Sep. 1, 2009, pp. 349-366, XP002680805, ISBN: 978-961-90610-7-7 Retrieved from the Internet: URL: http://www.ndt.net/.

* cited by examiner

FIG. 8A 7.5mm resolution

Position 11
for 1.5mm res

FIG. 8B

First column
of 5 samples

FIG. 8C

All 25 samples
collected

FIG. 8D display of
interleaved data

SCANNER SYSTEM AND METHOD FOR HIGH-RESOLUTION SPATIAL SCANNING OF AN ELECTROMAGNETIC FIELD RADIATED BY AN ELECTRONIC DEVICE UNDER TEST

FIELD OF THE INVENTION

The present invention relates to testing of electromagnetic compatibility and diagnosis of electromagnetic interference of electronic devices, and is particularly concerned with high-resolution spatial scanning of electromagnetic field levels generated by an electronic device under test.

BACKGROUND OF THE INVENTION

The EMC/EMI problem in the performance of electronic devices, such as printed circuit boards, refers to the lack of electromagnetic compatibility (EMC) of device components due to electromagnetic interference (EMI) between them. The EMC/EMI problem involves one device component (a source) generating an electromagnetic field that propagates through a coupling path to another device component (the receiver). The electromagnetic field induces the receiver to radiate an electromagnetic field that is different from what is desired of the receiver.

To test for and diagnose EMC/EMI problems, a designer or manufacturer of an electronic device may use a scanner to detect the electromagnetic field levels radiated by the electronic device. A spectral scan may be performed to determine electromagnetic field levels at a variety of desired frequencies. In addition or in the alternative, a spatial scan may be performed to map electromagnetic field levels at a designated frequency at different sampling locations relative to the electronic device. In this manner, a spatial scan can assist in identifying the components of the device that are responsible for an EMC/EMI problem.

In a spatial scan, it may be preferable for the distance between sampling locations of the spatial scan to be small relative to the size and spacing of the device components. For example, a resolution of less than a millimeter may be required to discriminate between the electromagnetic fields radiated by the miniaturized components packaged on a printed circuit board used in a compact cellular phone under test. However, decreased spacing between sampling locations increases the number of sampling locations for a given scan area and the time required to complete the spatial scan. For prior art scanners having a single probe, the probe must be moved to each and every sampling location, which can make it prohibitively time-consuming to perform a spatial scan having hundreds or thousands of sampling locations.

Accordingly, there is a need in the art for a scanner system that is operable to more efficiently perform high-resolution scanning of electronic devices.

SUMMARY OF THE INVENTION

The invention provides a scanner system and a method for performing a high-resolution spatial scan of an electromagnetic field radiated by an electronic device.

In one aspect, the present invention comprises a scanner system operable for high-resolution spatial scanning of an electromagnetic field radiated by an electronic device under test (DUT). The scanner system comprises: a probe array comprising a plurality of switched probes, wherein adjacent probes are spaced apart at a separation distance; an analyzer connected to the probe array for determining the electromagnetic field level at each probe location based on a signal induced in each probe by the radiated electromagnetic field; an actuator for changing the relative position of the probe array to the DUT, from a first array position to a second array position; and a computer comprising a processor and a memory. The processor is operatively connected to the analyzer and the actuator, and the memory component stores a set of instructions executable by the processor to implement a method comprising the steps of:

(a) measuring the electromagnetic field level at each probe when the probe array is in the first array position to create a first dataset of electromagnetic field levels at the position of each probe in the probe array when in the first array position;

(b) controlling the actuator to change the relative position of the probe array to the DUT from the first array position to the second array position; and (c) measuring the electromagnetic field level at each probe when the probe array is in the second array position to create a second dataset of electromagnetic field levels at the position of each probe in the probe array when in the second array position.

In one embodiment, the scanner system further comprises a planar scan surface for placement of the DUT thereon. The scan surface may form the top surface of a case containing the probe array and the actuator.

In one embodiment, the probe array is formed as part of a printed circuit board.

In one embodiment, the probes are arranged in a substantially planar array of rows and columns.

In one embodiment, the probes comprise a first probe and a second probe having a different polarization than the first probe. The position of the second probe relative to the DUT when the probe array in the second array position may be substantially the same as the position of the first probe relative to the DUT when the probe array is in the first array position.

In one embodiment, the distance between the first array position and the second array position is less than or substantially equal to the separation distance of the adjacent probes.

In one embodiment, the analyzer is a spectrum analyzer.

In one embodiment, the actuator moves the probe array while the DUT remains stationary. In another embodiment, the actuator moves the DUT while the probe array remains stationary.

In one embodiment, the actuator comprises: an elongate first track; a first sliding member movable along the first track and attached to the probe array; and a first motor in driving engagement with the first sliding member for moving the first sliding member along the first track. The actuator may further comprise: an elongate second track disposed at an angle to the first track; a second sliding member movable along the second track and attached to the elongate first track; and a second motor in driving engagement with the second sliding member for moving the second sliding member along the second track.

In one embodiment, the scanner system further comprises a signal conditioner operatively connected to the probe array and the analyzer for amplifying or attenuating the signal induced in each probe before being transmitted by the analyzer.

In another aspect, the present invention comprises a method for high-resolution spatial scanning of an electromagnetic field radiated by an electronic device under test (DUT). The method comprises the steps of:

(a) providing a probe array comprising a plurality of switched probes, wherein adjacent probes are spaced apart at a separation distance;
(b) positioning the probe array relative to the DUT in a first array position;
(c) when the probe array is in the first array position, measuring the electromagnetic field level at each probe to create a first dataset of electromagnetic field levels at the position of each probe in the probe array when in the first array position;
(d) changing the relative position of the probe array to the DUT to a second array position; and
(e) when the probe array is in the second array position, measuring the electromagnetic field level at each probe to create a second dataset of electromagnetic field levels at the position of each probe in the probe array when in the second array position.

In one embodiment, the DUT rests on a scan surface while the probe array is moved from the first array position to the second array position.

In one embodiment, the probes comprise a first probe and a second probe having a different polarization than the first probe. The position of the second probe relative to the DUT when the probe array in the second array position may be substantially the same as the position of the first probe relative to the DUT when the probe array is in the first array position.

In one embodiment, the distance between the first array position and the second array position is less than the separation distance of the adjacent probes, preferably less than or equal to one half the separation distance of adjacent probes, and more preferably less than or equal to 1.5 mm, or less than or equal to $\frac{1}{5}^{th}$ the separation distance of adjacent probes.

In one embodiment, the step of measuring the electromagnetic field level in either one or both of the first array position and the second array position is performed over a range of frequencies.

As the distance between the first array position and the second array position may be less than the separation distance between the probes, the effective resolution of the scanner system can be made less than the separation distance between the probes. The amount of increased resolution may be adjustable between zero and the limit of the positional accuracy of the actuator. The computer can substantially automate the scanning process and may interleave the datasets resulting from the scans at different positions of the probe array, and cause a display device to show the spatial distribution of electromagnetic field levels at different positions of the DUT.

BRIEF DESCRIPTION OF THE DRAWINGS

In the drawings, like elements are assigned like reference numerals. The drawings are not necessarily to scale, with the emphasis instead placed upon the principles of the present invention. Additionally, each of the embodiments depicted are but one of a number of possible arrangements utilizing the fundamental concepts of the present invention. The drawings are briefly described as follows.

DETAILED DESCRIPTION OF PREFERRED EMBODIMENTS

The present invention comprises a scanner system and method for high-resolution spatial scanning of an electromagnetic field radiated by an electronic device-under-test. When describing the present invention, all terms not defined herein have their common art-recognized meanings. To the extent that the following description is of a specific embodiment or a particular use of the invention, it is intended to be illustrative only, and not limiting of the claimed invention. The following description is intended to cover all alternatives, modifications and equivalents that are included in the spirit and scope of the invention, as defined in the appended claims.

As used herein, an "electronic device" means any device having one or more components that is capable of radiating an electromagnetic field, irrespective of power or range, and irrespective of whether such electromagnetic field is generated or induced. Electronic devices include, but are not limited to, printed circuit boards.

As used herein, a "device-under-test" or "DUT" means an electronic device that produces a radiated electromagnetic field to be scanned by the scanner system of the present invention.

In one embodiment, the scanner system of the present invention has a probe array with a plurality of spaced-apart switched probes for sensing the electromagnetic field radiated by an electronic device under test (DUT). An actuator, or a combination of actuators, moves the probe array relative to the DUT to successive positions, which preferably are separated by distances less than or equal to the separation distance between the probes. As a result, the effective resolution of the scanner system may be made less than the separation distance between the probes. The increased resolution factor may adjustable between zero and the limit of the positional accuracy of the actuator. At each successive position of the probe array, an analyzer, such as a spectral analyzer, receives signals induced in the probes by the radiated electromagnetic field to determine the electromagnetic field levels. The scanning process can be substantially automated through the use of a computer which comprises components which controls the actuators and the analyzer, and stores data sets reflecting the position of each probe and the electromagnetic field level at each probe, at each successive position of the probe array. The computer may comprise components which interleave the datasets and cause a display device to display the interleaved results to show the spatial distribution of electromagnetic field levels at different positions relative to the DUT.

In one embodiment of the scanner system (10) of the present invention as shown in FIGS. 1 to 5, the scanner system (10) comprises a case (12), a DUT holding device in the form of a scan surface (18), a probe array (20) having a plurality of switched probes, an actuator (30), a signal conditioner (40), an analyzer (50), and a computer (60). The actuator (30), signal conditioner (40), analyzer (50) and computer (60) are operatively connected to perform functions as described below. In one embodiment as shown in the Figures, the signal conditioner (40), analyzer (50), and computer (60) are contained within the case (12). In other embodiments, each of the signal conditioner (40), analyzer (50), and computer (60) may comprise components contained outside of the case (12), or components partially within the case (12) and partially outside the case (12).

In the embodiment shown in FIGS. 1-5, the case (12) contains the probe array (20) and the actuator (30), and may also contain the signal conditioner (40), analyzer (50) and computer (60). In the embodiment shown in the Figures, the case (12) is a box-like container, formed from a bottom part (14) and a top part (16) that may be connected together with screws or dowels that insert into aligned slots or receptacles (15) formed in the bottom part (14) and top part (16). The bottom and side walls of the case (12) are made of electrically non-conductive anodized aluminum. The top part (16) of the case (12) defines an opening (17) to reveal the scan surface (18). The case (12) also defines one or more ports (19) for connecting the computer (60) or other internalized components of the scanner system (10) to an external power source, externalized components of the scanner system (10), or external output devices such as another computer or a display device.

The DUT holding device may comprise any suitable device for retaining the DUT in a stationary position relative to the probe array (20). In one embodiment as shown in the Figures, the DUT holding device comprises a scan surface (18) which provides a surface onto which the DUT can be placed. In the embodiment shown in the Figures, the scan surface (18) is made of a thin, flat membrane of glass, which interferes minimally with the propagation of electromagnetic radiation. The glass membrane is supported on rollers (21) that can be vertically adjusted relative to the bottom part (14) of the case (12) to horizontally level the scan surface (18). The scan surface (18) is revealed by the top opening (17) through a glass lid of the case (12). In other embodiments, the DUT holding device may comprise a stand, mount or a clamp type device.

The probe array (20) includes a plurality of switched probes, each of which is operable to sense the electromagnetic field radiated by the DUT at different regions of the DUT. The probes are spaced apart at a separation distance so that each probe is adjacent to a spatially distinct position of the scan surface (18), and thus occupies a distinct position relative to the DUT when placed on the scan surface (18).

Figure 8A:
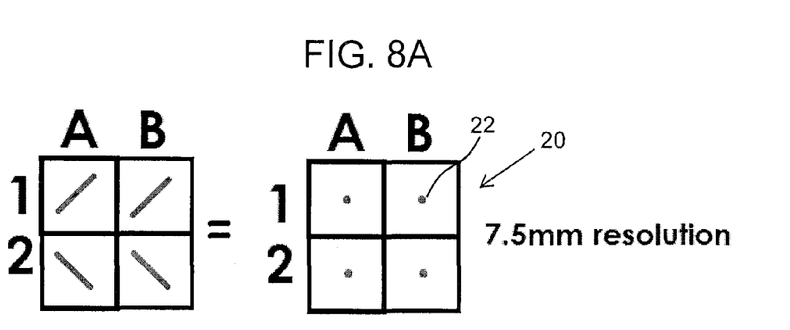
FIGS. 8A-8D are schematic depictions of a pattern of sampling locations for a spatial scan performed by one embodiment of the scanner system of the present invention.

In one embodiment as shown in FIG. 8A, the probes (22) of the probe array (20) are arranged in a rectangular array of equally spaced rows and columns. The probes (22) form a substantially planar rectangular array surface that is positioned within the case (12), beneath and substantially parallel to the scan surface (18). In other embodiments, not shown, the probes may be arranged in another array configuration such as a circular arrangement.

In one embodiment, the probe array (20) is manufactured as part of a printed circuit board (PCB). In one embodiment, the PCB has 1218 probes arranged in 29 rows and 45 columns, at a separation distance of 7.5 mm center to center, over a rectangular scan area of approximately 21.8 cm by 31.6 cm.

Figure 6:
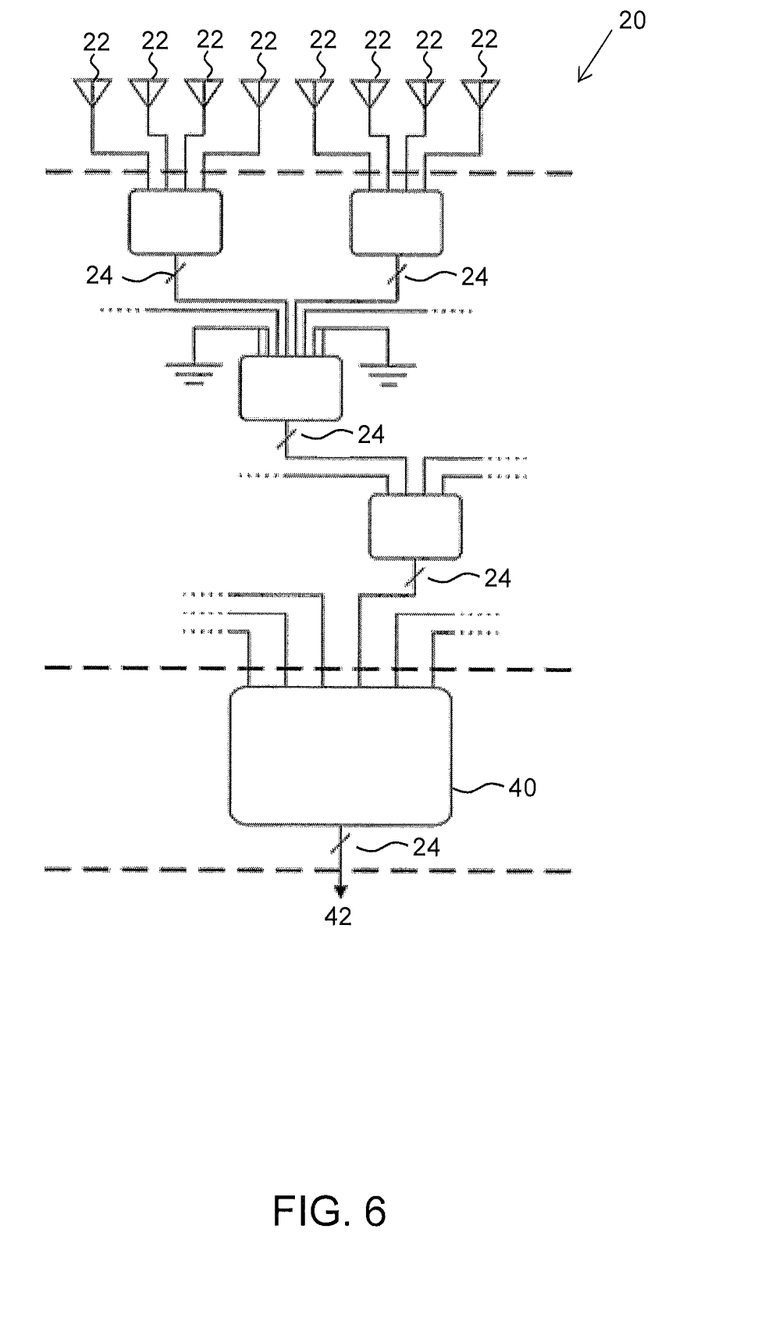
FIG. 6 shows a schematic diagram of the switched probe array and signal conditioner of one embodiment of the scanner system of the present invention.

In one embodiment as shown schematically in FIG. 6, these probes (22) of the PCB are connected in a tree-like structure of solid-state switches (24) that allow for rapid electronic switching on and off of the probes (22), and leads to the signal conditioner (40) that produces a single RF output (42).

In one embodiment, each probe (22) is a 2 mm×2 mm square loop H-field probe. The size of these probes means that a great many of them can be placed is a small space creating a high density array. The size of these probes also means that they are not efficient radiators, so that the DUT should be placed in close proximity (typically less than 2.5 cm) to the probe array (20).

Figure 7:
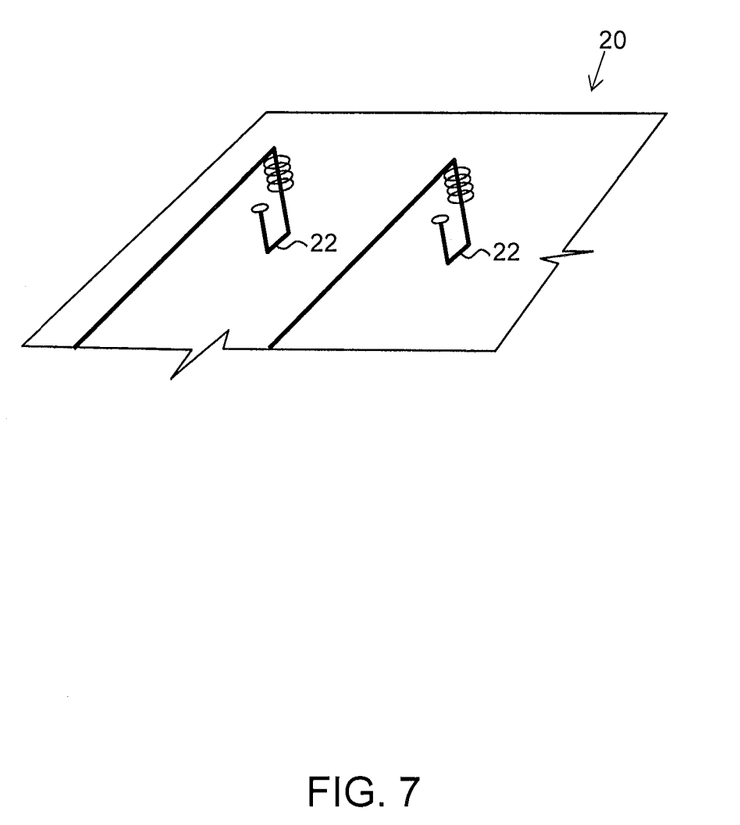
FIG. 7 shows a portion of a probe array having square half-loop probes, in one embodiment of a scanner system of the present invention.

In one embodiment as shown in FIG. 7, each probe (22) is formed by a square half-loop on a printed circuit board forming the probe array (20). The orientation of the square half-loop of these probes (22) causes an insensitivity to magnetic fields in certain directions or polarizations, thereby creating a "blind spot" of the probe (22), which can affect scan results. To mitigate the effect, in one embodiment, the orientation of probes (22) in adjacent rows or columns of the probe array (20) may be different, for example, they may be shifted by 90 degrees relative to each other. One embodiment of a technique for reducing the blind spot effect using such a probe array is further described below.

Figure 1:
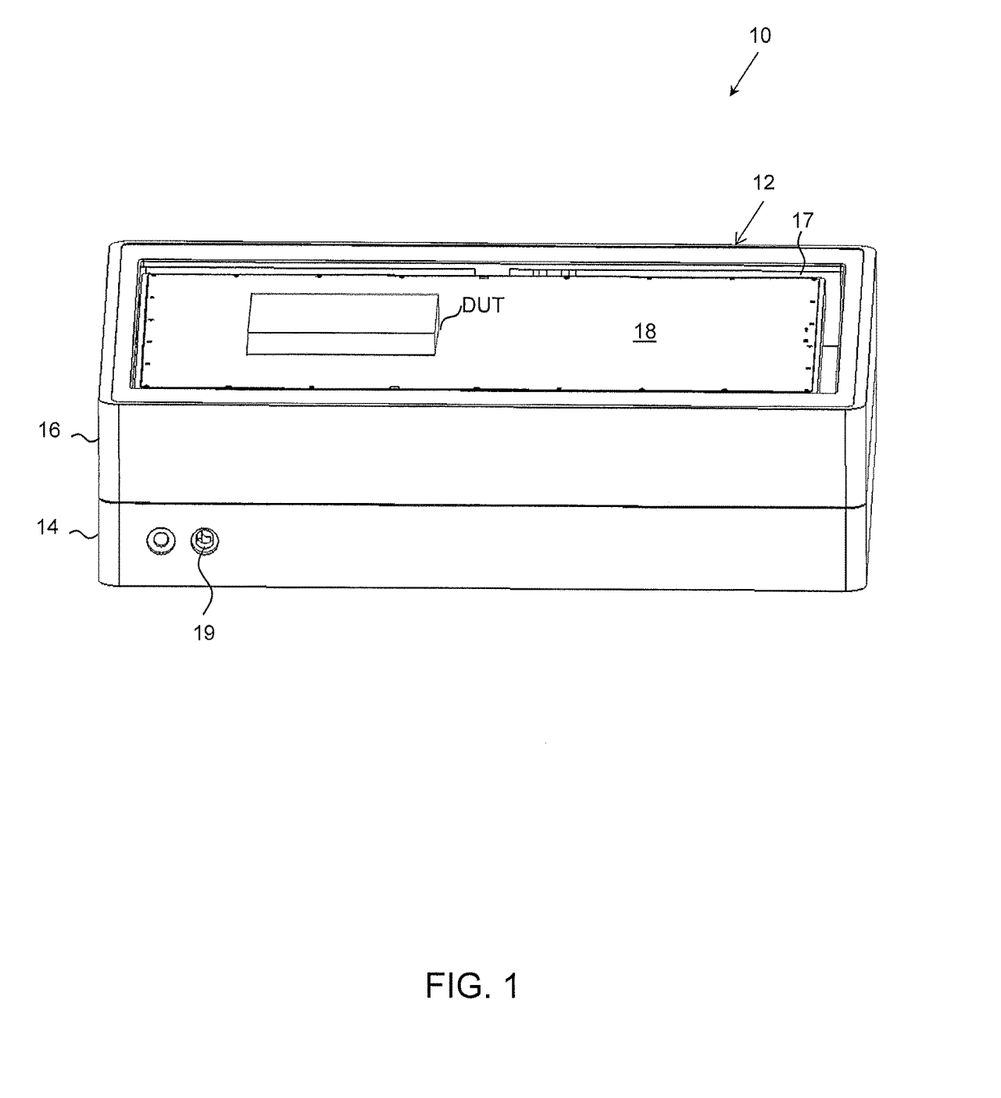
FIG. 1 shows a perspective view of the exterior of one embodiment of scanner system of the present invention, with a DUT placed on the scan surface.
Figure 2:
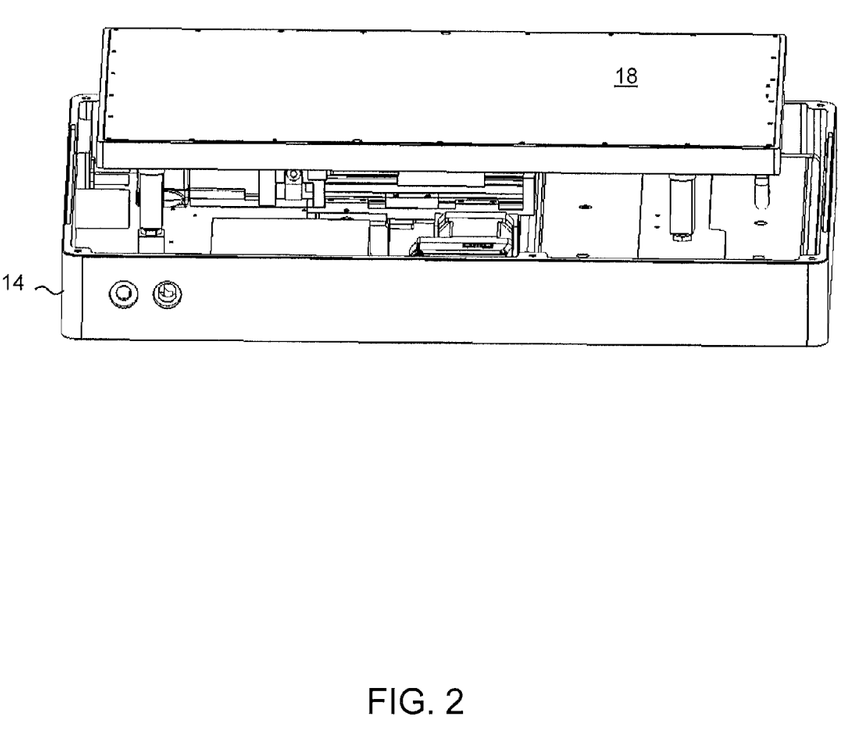
FIG. 2 shows an exploded perspective view of the exterior of the scanner system shown in FIG. 1, with the top part of the case removed.
Figure 3:
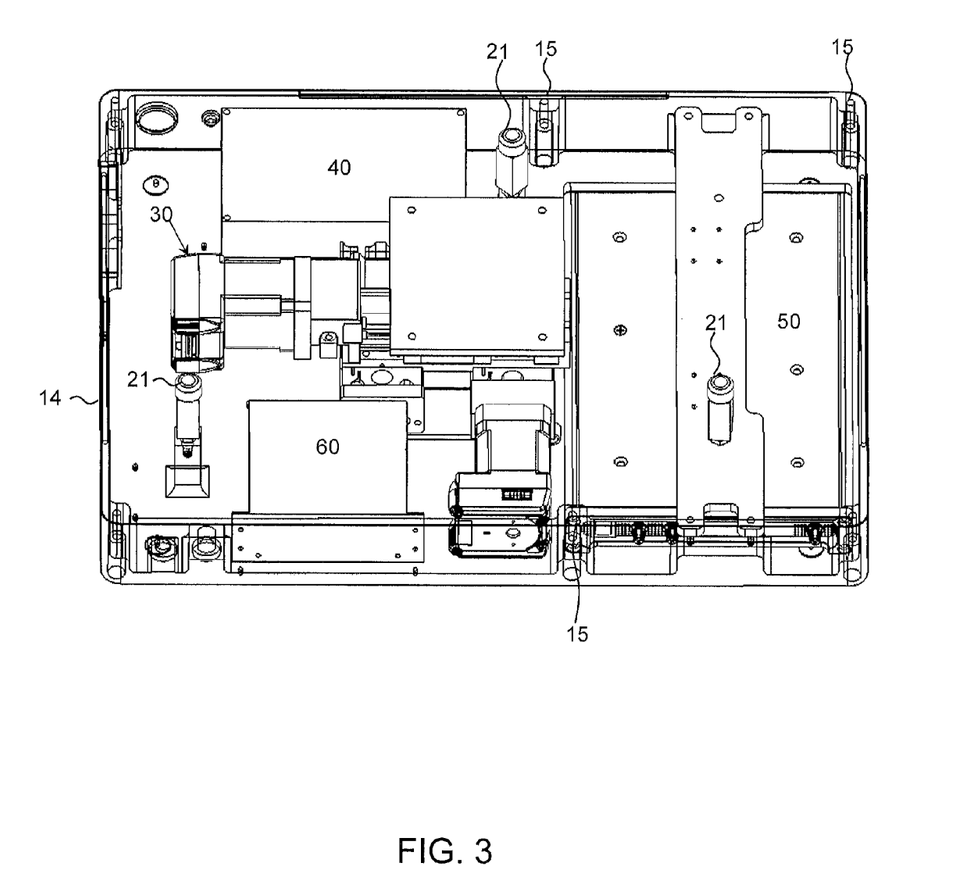
FIG. 3 shows a top perspective view of the interior the scanner system shown in FIG. 1, with the top part of the case and the scan surface removed.
Figure 4:
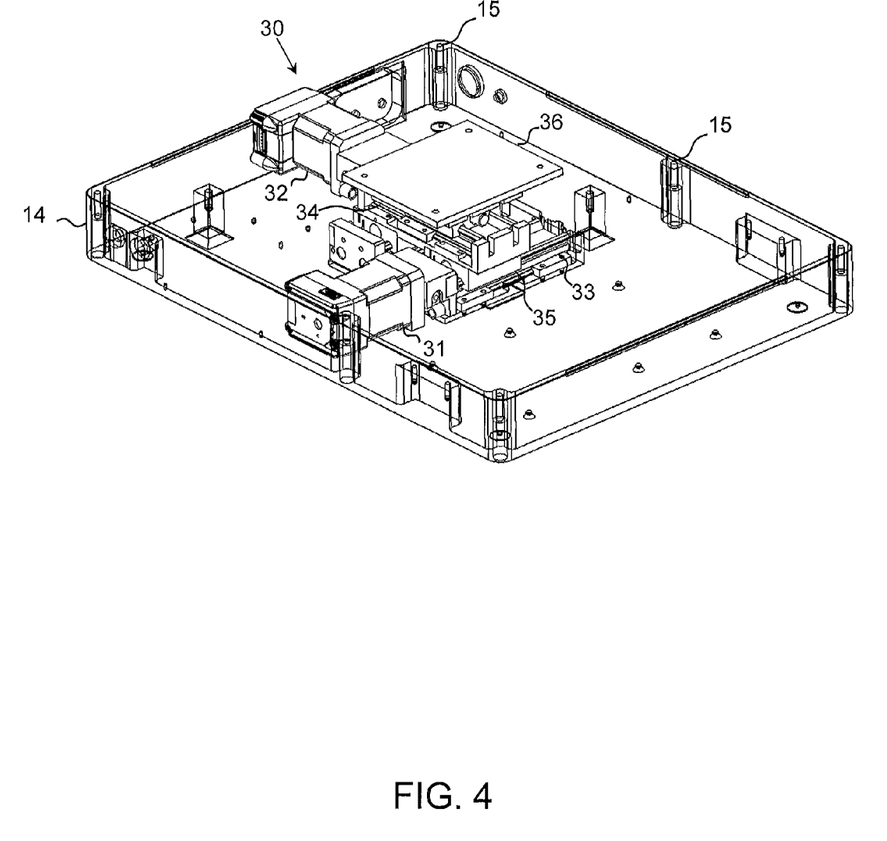
FIG. 4 shows a top perspective view of the interior of the scanner system shown in FIG. 1, with the top part of the case, the scan surface, the analyzer, signal conditioner and computer removed.
Figure 5:
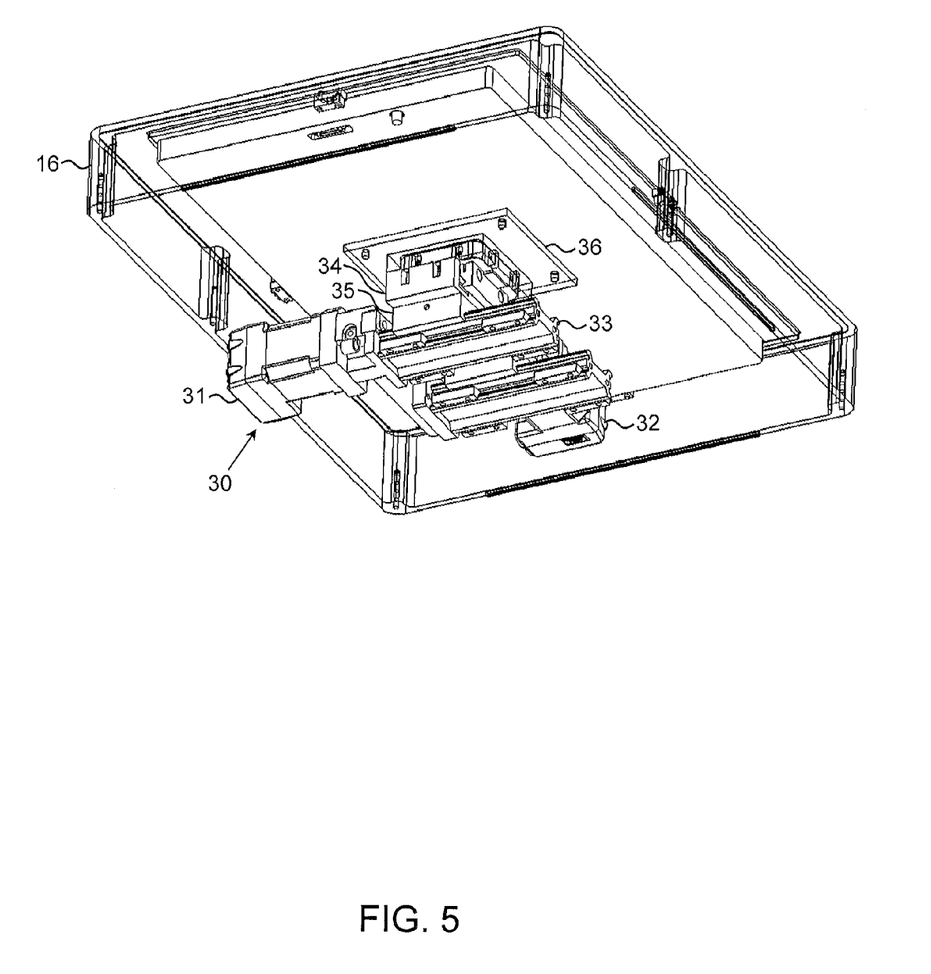
FIG. 5 shows a bottom perspective view of the interior of the scanner system shown in FIG. 1, with the bottom part of the case, the analyzer, signal conditioner and computer removed.

The actuator (30) may be any suitable electrically powered mechanism for either moving the probe array (20) relative to the DUT, or the DUT relative to the probe array, or both the probe array (20) and the DUT relative to each other, between a first array position and a second array position. In one embodiment, as shown in FIGS. 4 and 5, the actuator (30) moves the probe array (20) while the DUT remains stationary on the scan surface (18). The actuator (30) comprises a cross-slide mechanism comprising first and second electrically-powered motors (31, 32), elongate first and second linear tracks (33, 34), and first and second sliding members (35, 36). The first track (33) is secured to the interior of the bottom part (14) of the case (12). The first motor (31) is in driving engagement with the first sliding member (35) to slide it along the elongate direction of the first track (33). The second track (34) is secured to the first sliding member (35) and, as such, slides with the first sliding member (35) along the first track (33). The second motor (32) is in driving engagement with the second sliding member (36) to slide it along the elongate direction of the second track (34). The probe array (20) is attached to the second sliding member (36), and as such slides with the second sliding member (36) along the second track (34). In one embodiment, the first and second tracks (33, 34) are disposed substantially perpendicularly to each other to allow the probe array (20) to be moved independently in substantially perpendicular directions in a substantially horizontal plane so that the probe array (20) can be selectively positioned at any desired position relative to the DUT placed on the scan surface (18). In other embodiments not shown, the actuator (30) may move the DUT holding device, while the probe array (20) remains stationary. In another embodiment not shown, the actuator (30) may move both the probe array (20) and the DUT.

The first array position and the second array position correspond to spatially distinct positions of the probe array (20) relative to the scan surface (18), such that each probe (22) of the probe array (20) projects onto a different point on the scan surface (18) when the probe array (20) is in the first array position, in comparison with when the probe array (20) is in the second array position.

The distance between the first array position and the second array position may be selected for any desired spatial resolution. In one embodiment, the first array position and the second array position are separated by a distance less than the separation distance of the probes in the probe array (20). In another embodiment, the first and second array positions are separated by a distance substantially equal to the separation distance between adjacent rows or columns of probes in the probe array (20). Accordingly, if the probes are formed by polarized probes (such as the square half-loop probes, as described above) and the orientations of adjacent probes are shifted relative to each other so that the polarizations are different, the electromagnetic field at a particular spatial location of the scan surface (18) can be measured by a probe of one polarization when the probe array (20) is in the first array position, and by the adjacent probe of a different polarization when the probe array (20) is in the second array position.

The signal conditioner (40) receives the signal induced in the probes of the probe array (20) by the electromagnetic field radiated by the DUT, prior to being transmitted to the analyzer (50). The signal conditioner (40) may comprise one or more amplifiers for amplifying the signal, one or more attenuators for attenuating the signal, or a combination of amplifiers and attenuators, to ensure that the signal is within the amplitude range of the analyzer (50).

The analyzer (50) measures the electromagnetic field level radiated by the DUT at each probe location based on a signal induced in each probe (22) by the radiated electromagnetic field. In one embodiment, the analyzer (50) may be a spectrum analyzer that measures the electromagnetic field levels over a range of frequencies. The technology of analyzers is well known to those skilled in the art and is not part of the present invention. Non-limiting examples of analyzers that are suitable for use with the present invention include spectrum analyzers manufactured by Agilent Technologies Canada Inc.™ (now Keysight Technologies™) (Mississauga, Ontario, Canada) under the model series names PSA, PXA, MXA, CXA, EXA, N9912A, and 9918A.

The computer (60) includes a processor and a memory component. The processor is operatively connected to the actuator (30), the signal conditioner (40), and the analyzer (50). The memory component stores a set of instructions executable by the processor to implement a method of the present invention during the use of the scanner system (10). The stored instructions may be programmable by the user of the scanner system (10).

Functionally, the computer (60) has an actuator module to determine the position of the probe array (20) and to control the movement of the probe array (20) by the actuator (30). In one embodiment as shown in the Figures, the actuator module controls the supply of power to the motors (31, 32), so as to move the first and second sliding members (35, 36) in small (e.g., 0.1 mm) increments along the first and second tracks (33, 34), respectively. In one embodiment, the actuator module of the computer (60) may allow the user to set the spatial resolution of the scan at a desired value, or select a preset spatial resolution value such as 0.50 mm, 0.75 mm, 1.50 mm, 2.50 mm, 3.75 mm, or 7.50 mm.

The computer (60) also has an analyzer-probe module to control the probe array (20) and the analyzer (50) to determine the level of the electromagnetic field at each probe (22) of the probe array (20). The analyzer-probe module electronically switches individual probes of the probe array (20) on and off in a sequential manner to determine the electromagnetic field detected by each of the probes (22). In one embodiment, the analyzer-probe module of the computer (60) corrects for any losses in RF paths by de-embedding the RF path losses from the switched probe array (20) (e.g., due to the discontinuity introduced by the probe array) and transforming the conducted levels of signals from the probe array (20) in the RF paths to radiated levels of electromagnetic fields detected by the probe array (20). These corrections are made by individually calibrating each probe and its RF path to determine compensation data for each probe, which can be stored and applied to measurement results at run time of the scanner system (10). The computer (60) may be configured to process the signal data in accordance with the methods described in U.S. Pat. No. 7,672,640, the entire contents of which are incorporated by reference herein, where permitted.

In one embodiment, the computer (60) also has a display module that controls a display device (e.g., a computer monitor) to output data from the probe-analyzer module in a human readable form.

The use of the scanner system (10) of the present invention to perform a spatial scan of an electromagnetic field radiated by a DUT is now described through a simplified example, with reference to FIGS. 8A to 8D, 9 and 10. In FIGS. 8A to 8D, the positive and negative "column directions" refer to the upwards and downwards directions, respectively, while the positive and negative "row directions" refer to the rightwards and leftwards directions, respectively. In this simplified example, the probe array (20) has four probes (22) in total, arranged in a planar rectangular array of 2 rows and 2 columns that are spaced apart at 7.5 mm, center to center. It will be understood that, in practice, the probe array (20) may have a much larger number of probes covering a larger scan area. In FIG. 8A, the four dots indicate the starting positions of the four probes (22), each centered within its own cell measuring 7.5 mm×7.5 mm.

Figure 10:
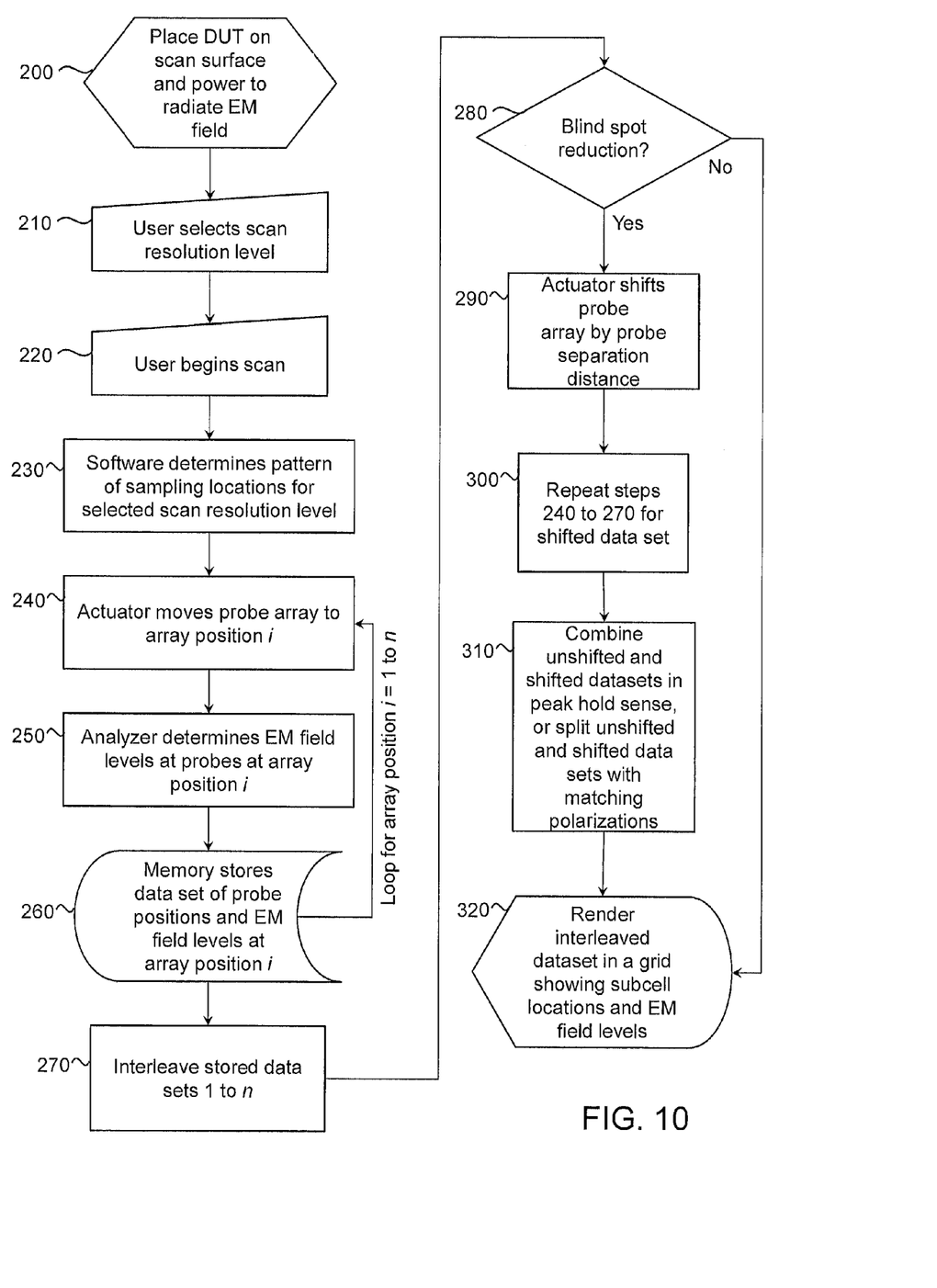
FIG. 10 is a flow chart showing the steps of one embodiment of the method of the present invention.

To begin the spatial scan, the user places the DUT on the scan surface (18) and powers the DUT to radiate the electromagnetic field (step 200). Once the DUT is placed on the scan surface (18), the position of the DUT remains unchanged until the spatial scan is complete. In this manner, any subsequent movement of the probe array (20) relative to the scan surface (18) will result in predictable relative movement between the probes and the DUT from a first array position to a second array position.

Next, the user programs the computer (60) with the desired scan resolution level, which refers to the spacing between sampling points in the spatial scan (step 210). In this example, the user selects a scan resolution of 1.5 mm in the row direction and 1.5 mm in the column direction. The scan resolution need not be the same in the row and column directions. Once this information has been selected, the user commands the computer (60) to begin the scanning process (step 220), The scan resolution factor in one dimension is equal to 'd/n' where 'd' is the probe separation distance, and 'n' is the scan resolution level. In this example, the scan resolution factor is 7.5/1.5 in each of the row and column dimensions, and $(7.5/1.5)^2$ for the grid. In other words, the overall scan resolution will be 25 times greater than a static scan resolution with the same probe array (20).

Figure 8B:
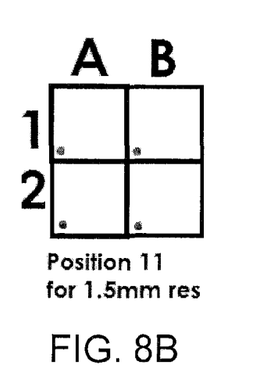

The actuator module of the computer (60) determines the pattern of sampling locations based on the selected scan resolution level (step 230). In this example, with a selected scan resolution level of 1.5 mm, each probe will have a scan pattern of n=25 sampling locations within its cell, with the sampling parts spaced apart at 1.5 mm. The first sampling location, designated as position 11 in FIG. 8B, is positioned 0.75 mm in the positive column direction and 0.75 mm in the positive row direction from the lower-left corner of the cell. This pattern of sampling locations provides an even distribution of sampling points and prevents the probes from overlapping into cells of adjacent probes.

Figure 8C:
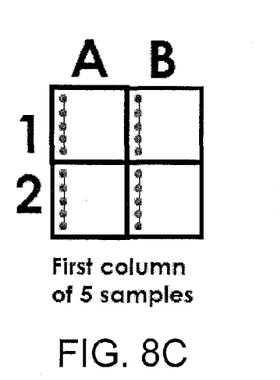
Figure 8D:
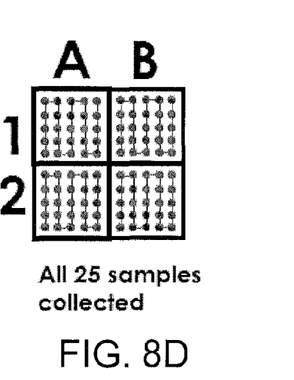

The actuator module of the computer (60) then controls the actuator (30) to move the probe array (20) into the first array position, as shown in FIG. 8B (step 240). The four dots indicate the sampling locations of the four probes relative to the scan surface (18) when the probe array (20) is in the first array position. The computer (60) then determines the position of the probes and controls the analyzer (50) to determine the electromagnetic field level at each one of the probes, based on the signal induced in that probe by the radiated electromagnetic field (step 250). The computer (60) stores the position of each probe and the associated determined electromagnetic field level at each probe in a first data set (step 260). The computer (60) repeats this process for the second through fifth array positions by moving the probe array (20) in the positive column direction as shown in FIG. 8C. The computer (60) repeats this process for the sixth through twenty-fifth array positions by moving the probe array (20) in 1.5 mm increments in the positive row direction and in the column directions, as necessary. In one embodiment as show in FIG. 8D, the probe array (20) is moved in both the positive and negative column directions to trace a serpentine route and thus minimize the necessary amount of movement of the probe array (20).

For each position of the probe array (20), the analyzer-probe module of the computer (60) electronically switches on and off each of the probes in a sequential manner to determine the electromagnetic field levels at each of the probes in the probe array (20). If desired, the analyzer-probe module of the computer (60) may also de-embed the RF path losses and transform conducted signal levels to radiated levels. After the twenty-five spatial scans have been performed, the computer (60) processes the resulting twenty five data sets, by interleaving the data to make a single spatial scan having 100 sample points, i.e. 4×(5×5) (step 270).

Figure 9:
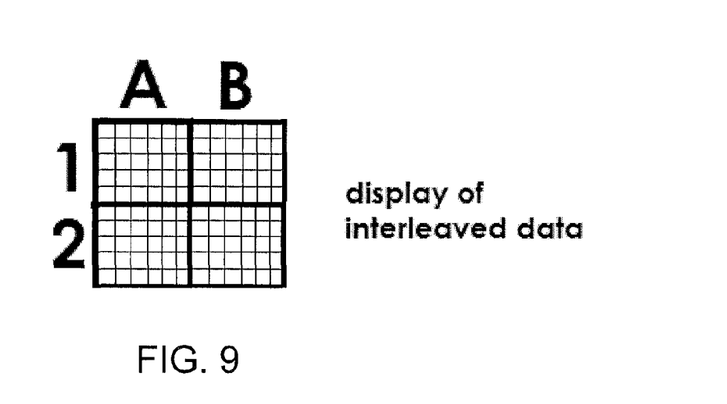
FIG. 9 is a schematic depiction of the display of electromagnetic field level data corresponding to the pattern of sampling locations shown in FIG. 8D.

The display module of the computer (60) may then cause an output device such as a computer monitor to graphically show the scan data. For example, in one embodiment as shown in FIG. 9, the electromagnetic field levels may be displayed spatially in an array corresponding to the array of scan locations. Different ranges of electromagnetic field levels may be represented by different colors to produce a map of electromagnetic field levels for the DUT.

In comparison to the use of a single probe, the combined effect of the spatial separation of probes in the probe array (20) and the sub-spacing movement of the probe array (20) allows the scanner system (10) to reduce the scanning time by a factor of the number of probes in the probe array. Decreasing the sub-spacing movement of the probe array (20) increases the spatial resolution of the scanner system (10), but also the necessary run-time to perform a scan. Thus, in one embodiment, the computer (60) may be configured to execute an algorithm to spatially interpret signal parameters between probe measurement locations. As the system moves to higher resolution scanning, these algorithms are less critical as the estimated results can be replaced by actual measurement data.

Optionally, the scanner system (100) may reduce the blind spot effect caused by any polarization of the probes, provided that the probe array (20) contains probes of differing orientations. For example, in FIG. 8A, the probes may be square half-loop probes with the probes originally in column "A" being shifted 90 degrees in polarity from the probes originally in column "B". If the user wishes to reduce the blind spot effect, the actuator (30) moves the probe array (20) by the separation distance of 7.5 mm in the positive row direction (step 290), so that the probes originally in column "A" are situated in column "B". Thereafter, the spatial scanning process as described above is repeated to create a "shifted" dataset for the scan locations in column "B" (step 300). This shifted dataset can be compared with the dataset generated prior to the shift (i.e., the "unshifted" dataset) to determine the maximum "peak hold" electromagnetic field levels at each sampling location (step 310). Since each sampling location will now have a measurement from a probe in each of the two possible planar polarizations, the peak hold from these two measurements will approximately equal to the true maximum possible signal. Alternatively, the "unshifted" and "shifted" data sets can be split with matching polarizations to create a polarized view of the electromagnetic fields (step 310). In this case, the algorithm is not looking for the peak signal but rather grouping all measurements together which have the same polarization. Because of the shift of one column, there will be a measurement in each of the two possible planar polarizations at each of the spatially distinct locations in the initial array position except for column "A". This first column "A" can also be measured in a different polarization if the probe array (20) is shifted to the left by the distance of one column separation from the initial location of the probe array (20).

Once the dataset has been interleaved, the display module of the computer (60) causes a display device to display the interleaved data in a series of grid points corresponding to the different sampling locations, with color-coded regions indicating the intensity of the electromagnetic field for different frequencies, at the sampling points (step 320). The scan data may be processed to create a spectral-spatial span in accordance with known methods, such as the methods described in U.S. Pat. No. 6,268,738, the entire contents of which are incorporated herein by reference (where permitted).

Using the scanner system (10) to perform the spatial scan in the manner described above may provide several potential advantages. First, the scanner system (10) can be used to achieve an effective resolution that is smaller than the probe separation distance. In the example described above, the scanner system (10) has an effective resolution of 1.5 mm even though the probe separation distance is 7.5 mm. Second, the effective resolution of the scanner system (10) can be varied by controlling the movement of the actuator (30). Third, the scanner system (10) may require fewer movements of the probe array (20) than there are sampling locations. In the example described above, only twenty-five moves of the probe array (20) are needed to produce a spatial scan having one hundred sampling locations. Fourth, it is unnecessary to move the probe array (20) more than the separation distance between the probes. In the example described above, without blind spot reduction, the probe array (20) needs to be moved less than 7.5 mm in the column and row directions because movement beyond this range would result in redundant sampling locations. This may allow the internal actuator (30) to be kept relatively compact and may make it easier to control fine movements of the probe array (20).

As will be apparent to those skilled in the art, various modifications, adaptations and variations of the foregoing specific disclosure can be made without departing from the scope of the invention claimed herein.

What is claimed is:

1. A scanner system operable for high-resolution spatial scanning of an electromagnetic field radiated by an electronic device under test (DUT), the scanner system comprising:
   (a) a probe array comprising a plurality of switched probes, wherein adjacent probes are spaced apart at a predetermined separation distance;
   (b) an analyzer connected to the probe array for determining the electromagnetic field level at each probe location based on a signal induced in each probe by the radiated electromagnetic field;
   (c) an actuator for changing the relative position of the probe array to the DUT, from a first array position to a second array position;
   (d) a computer comprising a processor and a memory, wherein the processor is operatively connected to the analyzer and the actuator, and wherein the memory component stores a set of instructions executable by the processor to implement a method comprising the steps of:
      (i) measuring the electromagnetic field level at each probe when the probe array is in the first array position to create a first dataset of electromagnetic field levels at the position of each probe in the probe array when in the first array position;
      (ii) controlling the actuator to change the relative position of the probe array to the DUT from the first array position to the second array position; and
      (iii) measuring the electromagnetic field level at each probe when the probe array is in the second array position to create a second dataset of electromagnetic field levels at the position of each probe in the probe array when in the second array position.

2. The scanner system of claim 1 further comprising a planar scan surface for placement of the DUT thereon.

3. The scanner system of claim 2 wherein the scan surface forms the top surface of a case containing the probe array and the actuator.

4. The scanner system of claim 1 wherein the probe array is formed as part of a printed circuit board.

5. The scanner system of claim 1 wherein the probes are arranged in a substantially planar array of rows and columns.

6. The scanner system of claim 1 wherein the probes comprise a first probe and a second probe having a different polarization than the first probe.

7. The scanner system of claim 6 wherein the position of the second probe relative to the DUT when the probe array in the second array position is substantially the same as the position of the first probe relative to the DUT when the probe array is in the first array position.

8. The scanner system of claim 1 wherein the distance between the first array position and the second array position is less than the predetermined separation distance of the adjacent probes.

9. The scanner system of claim 8 wherein the distance between the first array position and the second array position is less than one half the predetermined separation distance of adjacent probes.

10. The scanner system of claim 9 wherein the distance between the first array position and the second array position is less than or equal to 1.5 mm, or less than or equal to $\frac{1}{5}^{th}$ the predetermined separation distance of adjacent probes.

11. The scanner system of claim 1 wherein the analyzer is a spectrum analyzer.

12. The scanner system of claim 1 wherein the actuator comprises:
   (a) an elongate first track;
   (b) a first sliding member movable along the first track and attached to the probe array; and
   (c) a first motor in driving engagement with the first sliding member for moving the first sliding member along the first track.

13. The scanner system of claim 12 wherein the actuator further comprises:
   (a) an elongate second track disposed at an angle to the first track;
   (b) a second sliding member movable along the second track and attached to the elongate first track; and
   (c) a second motor in driving engagement with the second sliding member for moving the second sliding member along the second track.

14. The scanner system of claim 1 further comprising a signal conditioner operatively connected to the probe array and the analyzer for amplifying or attenuating the signal induced in each probe before being transmitted by the analyzer.

15. A method for high-resolution spatial scanning of an electromagnetic field radiated by an electronic device under test (DUT), the method comprising the steps of:
   (a) providing a probe array comprising a plurality of switched probes, wherein adjacent probes are spaced apart at a predetermined separation distance;
   (b) positioning the probe array relative to the DUT in a first array position;
   (c) measuring the electromagnetic field level at each probe when the probe array is in the first array position to create a first dataset of electromagnetic field levels at the position of each probe in the probe array when in the first array position;
   (d) changing the relative position of the probe array to the DUT to a second array position; and
   (e) measuring the electromagnetic field level at each probe when the probe array is in the second array position to create a second dataset of electromagnetic field levels at the position of each probe in the probe array when in the second array position.

16. The method of claim 15 wherein the DUT rests on a scan surface while the probe array is moved from the first array position to the second array position.

17. The method of claim 15 wherein the probes comprise a first probe and a second probe having a different polarization than the first probe, and the position of the second probe relative to the DUT when the probe array is in the second array position is substantially the same as the position of the first probe relative to the DUT when the probe array is in the first array position.

18. The method of claim 15 wherein the distance between the first array position and the second array position is less than the predetermined separation distance of the adjacent probes.

19. The method of claim 18 wherein the distance between the first array position and the second array position is less than or equal to 1.5 mm, or less than or equal to $\frac{1}{5}^{th}$ the predetermined separation distance of adjacent probes.

20. The method of claim 15 wherein the step of measuring the electromagnetic field level in either one or both of the first array position and the second array position is performed over a range of frequencies.

* * * * *